(12) United States Patent
Perng et al.

(10) Patent No.: US 6,369,418 B1
(45) Date of Patent: Apr. 9, 2002

(54) FORMATION OF A NOVEL DRAM CELL

(75) Inventors: Dung-Ching Perng, San Jose; Yauh-Ching Liu, Sunnyvale, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/112,687

(22) Filed: Jul. 9, 1998

Related U.S. Application Data (63) Continuation-in-part of application No. 09/045,633, filed on Mar. 19, 1998, now Pat. No. 6,090,661.

(51) Int. Cl.$^7$ ............................................. H01L 27/108
(52) U.S. Cl. ........................................ 257/296; 257/499
(58) Field of Search .............................. 257/296, 310, 257/499, 532

(56) References Cited

U.S. PATENT DOCUMENTS

| | | | |
|---|---|---|---|
| 4,353,086 A | 10/1982 | Jaccodine et al. ............ | 357/51 |
| 4,816,884 A | 3/1989 | Hwang et al. ............ | 357/23.6 |
| 4,914,740 A | 4/1990 | Kenney ...................... | 357/236 |
| 4,916,511 A | 4/1990 | Douglas .................... | 357/23.6 |
| 4,922,313 A | 5/1990 | Tsuchiya ................... | 357/23.6 |
| 4,999,689 A | 3/1991 | Iguchi et al. ................ | 257/303 |
| 5,026,658 A | 6/1991 | Fuse et al. .................... | 437/52 |
| 5,041,887 A | 8/1991 | Kumagai et al. .......... | 357/23.6 |
| 5,049,959 A | 9/1991 | Satoh ........................ | 357/23.6 |
| 5,064,777 A | 11/1991 | Dhong et al. ................ | 437/52 |
| 5,075,248 A | 12/1991 | Yoon et al. ................ | 438/244 |
| 5,112,771 A | 5/1992 | Ishii et al. ................... | 438/389 |
| 5,173,439 A * | 12/1992 | Dash et al. ................. | 438/424 |
| 5,200,354 A | 4/1993 | Om et al. .................... | 438/243 |
| 5,214,603 A | 5/1993 | Dhong et al. ............... | 365/207 |
| 5,273,928 A | 12/1993 | Tani ............................ | 437/52 |
| 5,315,543 A | 5/1994 | Matsuo et al. .............. | 365/149 |
| 5,395,786 A | 3/1995 | Hsu et al. ................... | 438/248 |
| 5,442,211 A | 8/1995 | Kita ........................... | 257/301 |
| 5,585,285 A | 12/1996 | Tang ........................... | 437/21 |
| 5,618,745 A | 4/1997 | Kita ........................... | 438/164 |
| 5,618,751 A | 4/1997 | Golden et al. .............. | 438/392 |
| 5,701,022 A | 12/1997 | Kellner et al. .............. | 257/300 |
| 5,844,266 A | 12/1998 | Stengl et al. ............... | 257/301 |
| 5,990,511 A * | 11/1999 | Leas ........................... | 257/296 |
| 5,998,822 A * | 12/1999 | Wada .......................... | 257/296 |
| 6,060,738 A * | 5/2000 | Hidaka et al. .............. | 257/296 |
| 6,090,661 A * | 7/2000 | Perng et al. ................. | 438/248 |
| 6,246,086 B1 * | 6/2001 | Kubota ....................... | 257/308 |

OTHER PUBLICATIONS

H. Hada, et al., "Using Anisotropical Selective Epitasial Silicon for Giga–Bit DRAMs," 1995, Kanagawa, Japan, *IEEE*.

* cited by examiner

*Primary Examiner*—Mark V. Prenty (57) ABSTRACT

A DRAM cell capacitor is described. Capacitor formation and cell isolation methods are integrated by using support sidewalls to form vertical DRAM capacitors. Doped polysilicon adjacent to the vertical sidewalls of the support provides one DRAM cell capacitor plate. The DRAM capacitor also contains a dielectric material that contacts and partially covers the doped polysilicon capacitor plate. Doped epitaxial silicon that contacts a portion of the dielectric forms the second capacitor plate and completes the DRAM capacitor.

22 Claims, 9 Drawing Sheets

FORMATION OF A NOVEL DRAM CELL

This application is a continuation-in-part of U.S. patent application Ser. No. 09/045,633 filed Mar. 19, 1998 and now U.S. Pat. No. 6,090,661, having Dung-Ching Perng and Yauh-Ching Liu as inventors, and titled FORMATION OF NOVEL DRAM CELL CAPACITORS BY INTEGRATION OF CAPACITORS WITH ISOLATION TRENCH SIDEWALLS. That application is incorporated herein by reference for all purposes.

BACKGROUND OF THE INVENTION

1. The Field of the Invention

The present invention relates to semiconductor devices and methods for their construction. More particularly, the present invention relates to capacitor design and cell isolation methods used to reduce the surface area occupied by a DRAM cell. More specifically, the present invention forms a DRAM capacitor under the access transistor thus increasing DRAM cell density by at least about two fold over currently fabricated DRAM cells. 2. Background Art Various DRAM capacitor designs have been employed to reduce the surface area occupied by a single DRAM cell. Early DRAM designs employed flat horizontal capacitor plates. Later designs, intended to conserve chip surface area, employed trenches or fin structures to form narrow dimension capacitors with some vertical contribution to the capacitor plate surface area.

In addition to the shape and size of the capacitor plates, the type of cell isolation contributes to the overall DRAM cell size. Traditionally, field oxide produced by the Local Oxidation of Silicon process (LOCOS) was used as cell isolation. Unfortunately, a field oxide must cover a fairly wide area in order to effectively isolate adjacent cells. Further, it is difficult to control the growth of field oxide. Therefore, field oxide often occupies a significant amount of the chip surface area.

More recently, trench isolation has been employed. This involves etching a narrow isolation trench around the active areas (cells) on the chip. The isolation trenches are then filled with oxide or other dielectric to effectively isolate adjacent active areas from one another. While trench isolation requires more process steps than LOCOS, trench isolation can be made much narrower than LOCOS oxide. Therefore, DRAMs employing trench isolation can be packed more densely than DRAMs employing field oxide (LOCOS) isolation.

In the continuing quest for higher density DRAMs, improved structures that conserve wafer surface are still needed.

SUMMARY OF THE INVENTION

The present invention addresses this need by providing a DRAM cell where an electrically insulating support structure serves as a scaffolding for capacitor formation and also electrically isolates adjacent DRAM cells. Integration of capacitor formation with DRAM cell isolation increases DRAM cell density by at least about two fold over currently fabricated DRAM cells.

In one aspect, the instant invention provides a DRAM cell comprised of a pass (or access) transistor, an electrically isolating support structure and a capacitor electrically coupled with the pass transistor that is formed on the vertical sidewalls of the support structure. The support structure isolates the DRAM cell from one or more adjacent DRAM cells. The capacitor is comprised of a first capacitor plate, a dielectric layer and a second capacitor plate. The first capacitor plate is defined by first conductive layer at the sidewall of the support structure. The second capacitor plate is defined by a second conductive layer adjacent to the support structure. The first and second capacitor plates are separated by the dielectric layer.

The pass transistor is a MOS device that may have a drain electrically connected to the first capacitor plate and electrically isolated from the second capacitor plate. In one embodiment, the support structure is between about 0.1 micrometer and about 10 micrometers. In a preferred embodiment, the support structure includes at least one of oxide (e.g., a spin on glass), nitride, or other low dielectric constant material. In one specific embodiment, the support structure includes oxide.

In one embodiment, the first conductive layer includes at least one of n-doped polysilicon and p-doped polysilicon. In another embodiment, the first conductive layer is between about 200 angstroms and about 1000 angstroms thick. In one embodiment the second conductive layer includes at least one of n-doped epitaxial silicon and p-doped epitaxial silicon. In another embodiment, the second conductive layer is between about 0.2 micrometers and about 7 micrometer high.

The dielectric layer may be made from any suitable material that can be formed in the necessary size and shape. Suitable dielectric materials include at least one of $SiO_2$, $Si_3N_x$, silicon oxynitride, ONO ($SiO_2/Si_3N_x/SiO_2$) layered material), tantalum pentaoxide ($Ta_2O_5$), barium strontium titanate $BaSrTiO_3$ ("BST") and piezoelectric lead zirconate titanate ("PZT"). Preferably, the dielectric layer comprises a material with a high dielectric constant (e.g., at least about 10) such as BST, PZT, or $Ta_2O_5$. In one specific embodiment, the dielectric layer is $Ta_2O_5$ and is between about 20 Å and about 200 Å thick depending on the capacitor plate area.

In one particular embodiment, the pass transistor is formed on a layer of epitaxial silicon. In a more specific embodiment, a doped layer in epitaxial silicon isolates the pass transistor from the second capacitor plate.

In another aspect, the invention provides a method for forming a capacitor on a support structure of an integrated circuit. The process is characterized by forming an electrically isolating support structure on a semiconductor substrate, providing a first capacitor plate on the vertical sidewalls of the support structure, providing a capacitor dielectric on at least a portion of the first capacitor plate and providing a second capacitor plate on a portion of the capacitor dielectric by forming a second conductive layer on the semiconductor substrate in regions outside of the support structure.

In one embodiment the support structure is between about 0.1 micrometer and about 10 micrometers high. In another particular embodiment, the support structure is between about 0.2 micrometers and about 1 micrometer high. In yet another embodiment the support structure is formed by blanket deposition of oxide or spinning on a glass.

The first capacitor plate may be formed by a process where the support structure is patterned to expose regions of the semiconductor substrate, blanket deposition of a liner layer, blanket deposition of a first conductive layer on the liner layer and anisotropically etching the first conductive layer so that it is retained on the vertical sidewalls of the support structure. In one embodiment, the liner layer may be nitride. In another embodiment the first conductive layer may be doped polysilicon. In yet another embodiment, the second conductive layer may be formed by growing doped epitaxial silicon.

The DRAM cell may be completed by a process comprising providing a spacer that electrically isolates the first capacitor plate and the second capacitor plate and forming a pass transistor that is electrically connected to the capacitor. The spacer is provide by a process comprising blanket deposition of nitride and anisotropically etching the nitride so that it is retained on a portion of the first conductive layer, on a portion of the dielectric layer and on a portion of the second conductive layer. In one embodiment a doped layer that isolates said pass transistor from said second conductive layer is formed. In a more specific embodiment, the doped layer includes n-type doped epitaxial silicon. In another embodiment the pass transistor is formed on a layer of epitaxial silicon. In a more specific embodiment the layer of epitaxial silicon is of the p-type.

These and other features and advantages of the present invention will be further described in the following detailed description of the invention with reference to the associated drawings.

BRIEF DESCRIPTION OF THE DRAWINGS

The invention will be further illustrated by reference to the following drawings in which.

DETAILED DESCRIPTION OF THE PREFERRED EMBODIMENTS

Figure 1A:
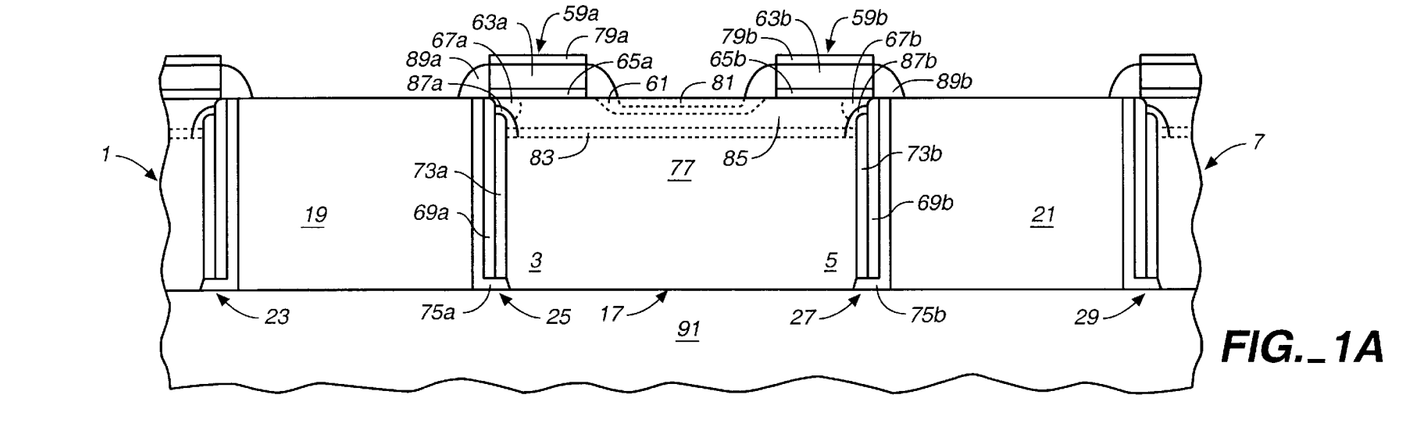
FIG. 1A is a cross sectional view of a multi-cell DRAM structure that illustrates a two cell active region flanked by two other two cell active regions (partially shown).
Figure 1B:
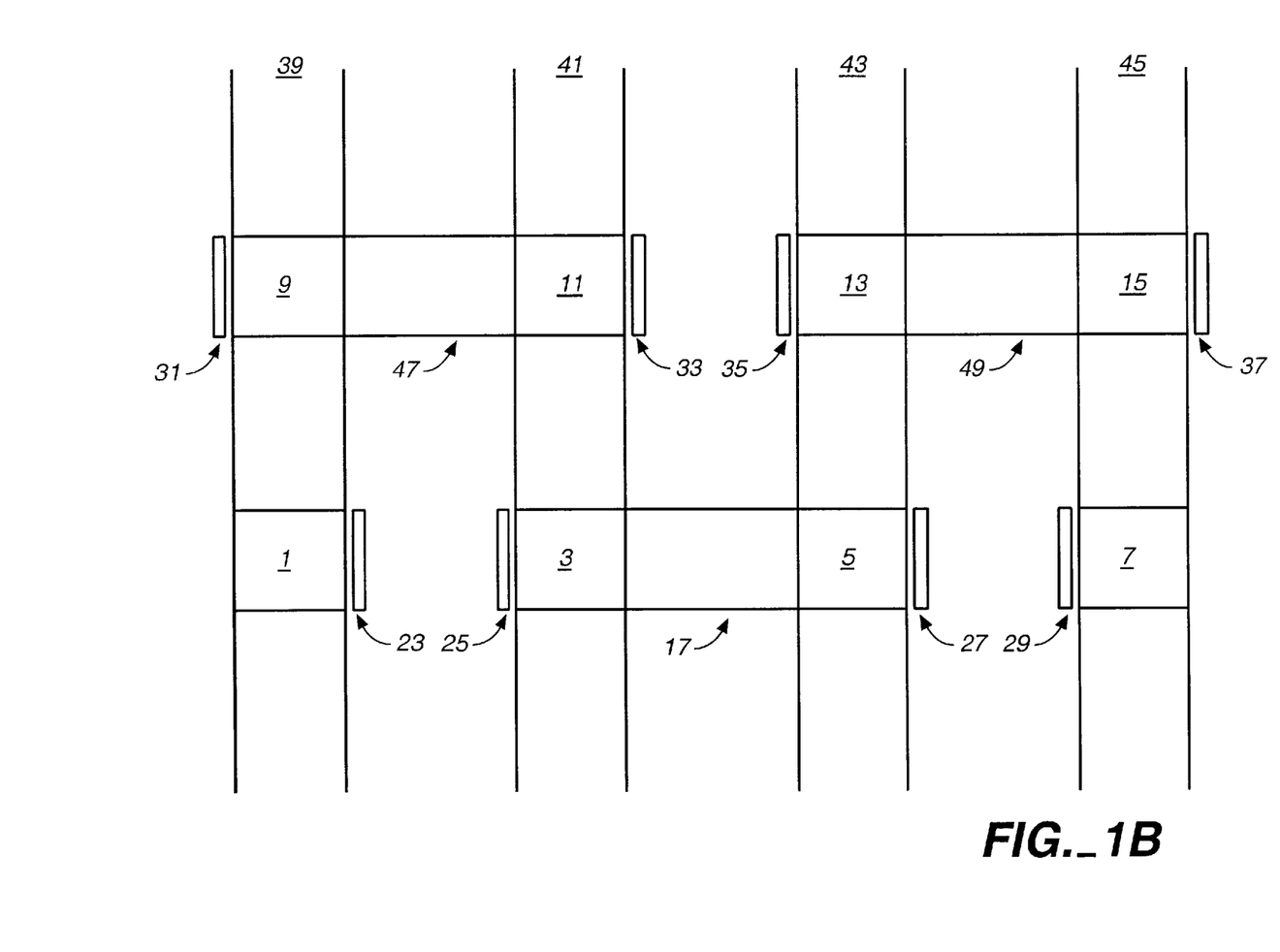
FIG. 1B is a top view of the multi-cell DRAM structure illustrated in FIG. 1A which shows a word line and bit line contact layout.
Figure 2:
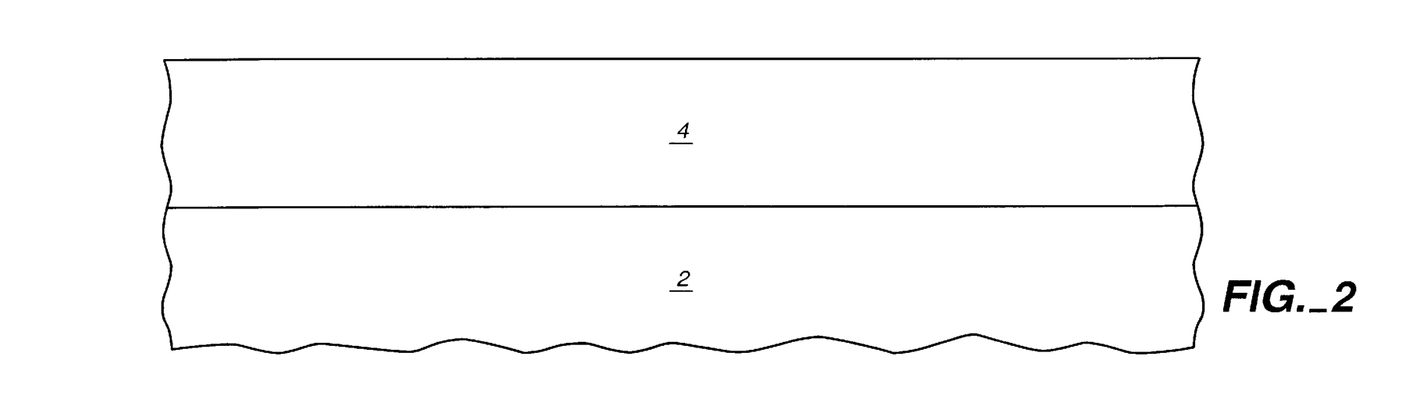
FIG. 2 is a cross sectional view of a partially fabricated DRAM device after support layer deposition.
Figure 3:
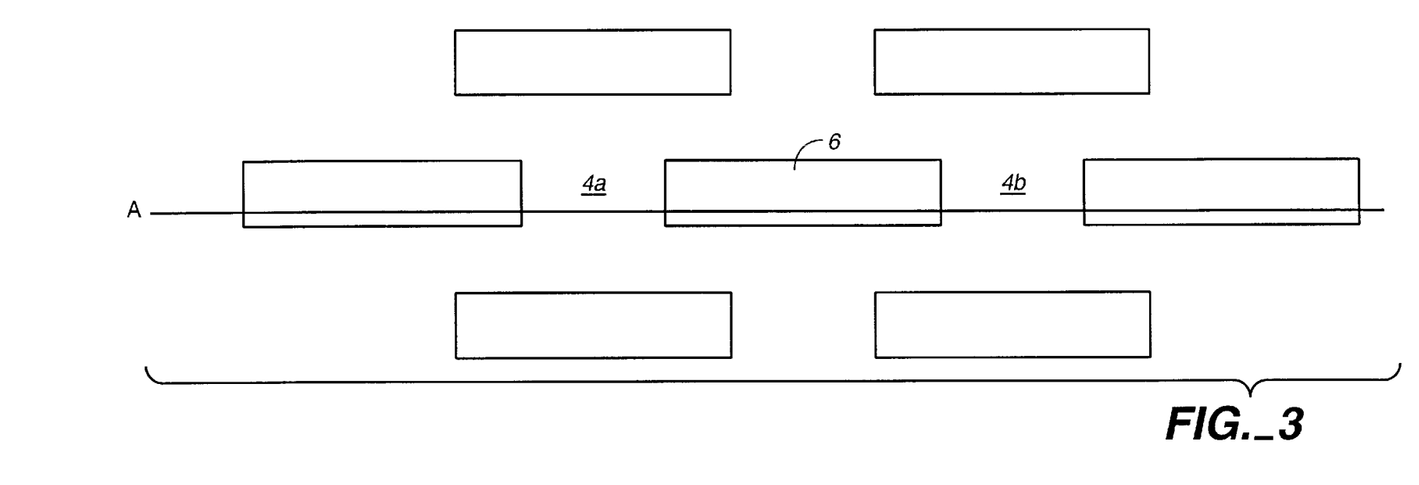
FIG. 3 is a is a top view illustrating a dark field mask for patterning a support.
Figure 4:
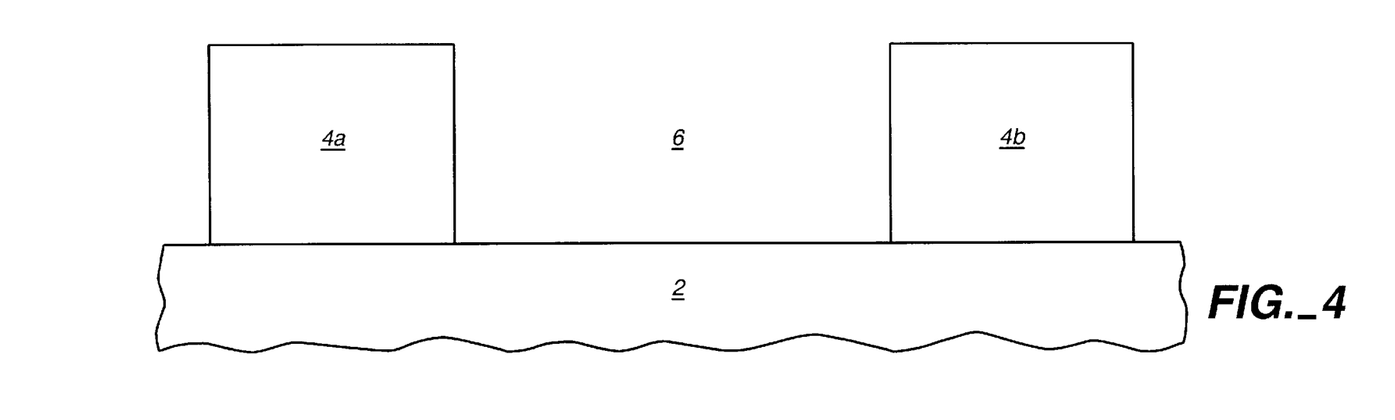
FIG. 4 is a cross sectional view of a partially fabricated DRAM device after patterning, including masking, support layer etch and mask removal.

A preferred embodiment of the present invention is now described with reference to FIGS. 1A, 1B, 2–8, 9A, 9B and 10–15 where like reference numbers indicate identical or functionally similar elements. FIGS. 1A and 1B illustrate cross sectional and top views of a multi-cell layout in the DRAM structure of the instant invention. FIGS. 2–4 show formation of a patterned support material that serves as scaffolding for a capacitor plate. FIGS. 5–8, 9A and 9B illustrate formation of a capacitor plate that is parallel and adjacent to the vertical sidewalls of the patterned support layer. FIGS. 10–14depict completion of the capacitor by dielectric deposition, spacer etch and formation of the second capacitor plate. FIG. 15 illustrates the partially fabricated DRAM device after conventional (or slightly modified) transistor process flow to form a pass (or access) transistor.

While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims.

FIG. 1A is a cross sectional view of a multi-cell DRAM structure illustrating one complete "two cell support isolation structure" flanked by two other two cell half support isolation structures (each partially shown). Note that the two cell support isolation structures in this layout are delineated by surrounding support isolation regions. Four different DRAM cells 1, 3, 5, 7 are associated with four different support sidewall capacitors 23, 25, 27 and 29 respectively. Capacitors 23 and 25 are located in the sidewalls of support section 19 while capacitors 27 and 29 are located on the sidewalls of support section 21. DRAM cells 3 and 5, associated with capacitors 25 and 27 respectively, comprise a complete two cell active structure. DRAM cells 3 and 5 share a common active region 85. Both DRAM cells 1 and 7, associated with capacitors 23 and 29 respectively, individually comprise one half of a two cell structure. For simplicity in the illustration, the second cells of those structures are not shown.

Cell 3 has an access transistor 59a including a source region 61 with silicide layer 81, a gate electrode 63a, a gate dielectric 65a (e.g. silicon oxide), silicide layer 79a, spacer 89a and a drain 67a. Source 61 and drain 67a will be doped regions of common conductivity type (e.g., both are n type) in a semiconductor substrate (preferably epitaxial silicon). Cell 5 similarly includes an access transistor 59b including source region 61 with silicide layer 81, a gate electrode 63b, a gate dielectric 65b, silicide layer 79b, spacer 89b and a drain 67b. Note that transistors 59a and 59b share source 61 and silicide layer 81. A bit line contact (not shown) connects to source 61. Cells 1 and 7 have similarly configured access transistors that are only partially depicted and are not specifically referenced in this discussion.

Capacitor 25 includes a first plate 69*a* (for storing charge), a capacitor dielectric layer 73*a*, and a second plate which comprises epitaxial semiconductor 77 and serves as a reference plate. Plate 69*a* is a vertical strip of conductive material adjacent to a portion of a vertical sidewall of support 19. Preferably plate 69*a* is formed from a doped polysilicon layer. Capacitor plate 69*a* is conductively isolated from plate 77 by an insulating spacer 87*a* and from capacitor 23 by support material 19 and a liner layer 75*a*. It is, however, conductively coupled to drain 67*a*. Significantly dielectric layer 73*a* contacts only a portion of plate 69*a*. The capacitor dielectric layer may be made from any compatible material such as silicon oxide, silicon nitride, silicon oxynitride, silicon oxide/silicon nitride/silicon oxide layered material, tantalum pentaoxide, BST, and PZT. Preferably, the dielectric layer is formed from a substance having a dielectric constant of at least about 10. Second capacitor plate 77 is preferably epitaxial silicon. Significantly, plate 77 contacts only a portion of dielectric layer 73*a*. Its conductivity type is opposite that of the source and drain regions (e.g., it is a p+ region when source 61 and drain 67*a* are n type). Plate 77 is covered by a narrow strip of epitaxial silicon 83 whose conductivity type is the same as the source 61 and drain 67*a*. Epitaxial silicon layer 83 isolates plate 77 and bulk semiconductor substrate 91 from access transistors 59*a* and 59*b*. Layer 83 is covered by epitaxial silicon layer 85 whose conductivity type is opposite that of source 61 and drain 67*a*. Note that layer 85 serves as the bulk region or "well" in which transistors 59*a* and 59*b* are formed. Source region 61 and drain regions 67*a* and 67*b* are formed as diffusions in layer 85.

Capacitor 27 is similarly configured to include a first capacitor plate 69*b* (conductive material abutting a sidewall of support 21), a dielectric layer 73*b*, spacer 87*b* and second capacitor plate 77. Capacitors 23 and 29 are similarly configured but are neither completely depicted nor specifically detailed by reference numbers in order to simplify the illustration.

FIG. 1B is a top view of the multi-cell DRAM structure illustrated in FIG. 1A which shows word line and bit line contact layout. FIG. 1B shows multiple rows and columns of DRAM cells and thus illustrates more DRAM cells than are depicted in FIG. 1A.

Wordlines 39, 41, 43 and 45 contact gates of DRAM cells 1, 3, 5, 7, 9, 11, 13 and 15 that include capacitors 23, 25, 27, 29, 31, 33, 35 and 37 respectively. Specifically, wordline 39 connects DRAM cells 1 and 9, wordline 41 connects DRAM cells 3 and 11, wordline 43 connects DRAM cells 5 and 13, and wordline 45 connects DRAM cells 7 and 15. DRAM cells 1, 3, 5 and 7 and capacitors 23, 25, 27 and 29 correspond to the DRAM cells and capacitors depicted in FIG. 1A.

Bitline contacts are provided to a region 17 located between DRAM cells 3 and 5, a region 47 located between DRAM cells 9 and 11 and a region 49 located between DRAM cells 13 and 15. Regions 17, 47 and 49 each comprise a shared active area or source between DRAM cells 3 and 5, DRAM cells 9 and 11 and DRAM cells 13 and 15 respectively. A bitline (not shown) overlies cells 1, 3, 5, and 7 and electrically connects to region 17. Another bitline (also not shown) overlies cells 9, 11, 13 and 15 and electrically connects to regions 47 and 49.

DRAM cells 3 and 5, 9 and 11, and 13 and 15, associated with isolation support capacitors 25 and 27, 31 and 33, 35 and 37 respectively, form two cell structures. Both DRAM cells 1 and 7, associated with capacitors 23 and 29 respectively, individually comprise one half of a two cell structure.

The parameter "F" is the minimum feature size attainable by a process employed to fabricate a memory device containing the DRAM cells of this invention (e.g., F defines both the minimum isolation trench widths and the minimum wordline widths attainable with the process under consideration). As depicted in FIG. 1B, the area required by adjacent DRAM cells 3 and 5 located on wordlines 41 and 43 is $8F^2$. This can be understood as follows. Wordlines 41 and 43 each require 1F, bitline contact 17 requires 1F (in the horizontally depicted dimension), and the portions of support 19 and 21 attributable to cells 3 and 5 is ½F each. Thus, cells 3 and 5 require, in total, 4F linear space in the horizontally depicted dimension. In the vertically depicted dimension, cells 3 and 5 occupy the width of bitline contact region 17 (1F) and their respective portions (½F) of adjacent support isolation regions located above and below (in the figure). Thus, cells 3 and 5 require, in total, 2F linear space in the vertically depicted dimension. As shown, the size of a two cell unit made by the method of the instant invention is $8F^2$. A single cell requires $4F^2$, which is a substantial improvement over the 8–9 $F^2$ available through conventional DRAM technology. Thus, the instant invention provides DRAM cells which require significantly less wafer surface area than DRAM cells made using existing technology.

The above DRAM devices may be formed by any suitable process. In general, the process will include steps of forming a support, patterning the support, forming capacitors on the support structure's vertical sidewalls, and forming pass transistors for accessing the capacitors. One process for fabricating a DRAM device of the instant invention will now be described, referring initially to FIG. 2.

The process begins with a blanket deposition of a support material on a semiconductor substrate (e.g., a single crystal silicon wafer) which is patterned to define an array of two cell active regions and surrounding support lattice work as depicted in FIGS. 1A and 1B. In other words, the array layout includes a repeating array of rectangular active areas (each 1F by 3F, vertical to horizontal) containing the pass transistors for two adjacent DRAM cells sharing a common source (e.g., cells 3 and 5 together with bitline contact region 17, cells 9 and 11 together with bitline contact region 47, etc.) delineated by a continuous support latticework.

FIG. 2 is a cross sectional view of a partially fabricated DRAM device after blanket deposition of a dielectric material, which is preferably oxide, on semiconductor substrate 2 by Chemical Vapor Deposition (CVD) or other suitable process. Semiconductor substrate 2 is preferably a uniformly lightly p doped single crystal silicon wafer. Alternatively, semiconductor substrate 2 can be a lightly n doped single crystal silicon wafer and/or include regions of nonuniform doping and may even include an epitaxial layer. Preferably, support layer 4 is between about 0.1 µm and about 10 µm high (most preferably between about 0.2 µm and about 1 µm high). After patterning, support layer 4 will provide a support for capacitor formation and also electrically isolates adjacent DRAM cells.

FIG. 3 is a top view illustrating a mask for patterning support 4. Regions 4*a* and 4*b* represent protected regions of oxide while regions 6 represent the exposed areas of oxide which will eventually form the active regions (to be formed later) and run perpendicular to the wordlines (to be formed later).

FIG. 4 is a cross sectional view of a partially fabricated DRAM device taken through the horizontal cross section line A shown in FIG. 3 after masking, patterning, oxide etch and mask removal. Masking and patterning are performed using conventional methods well known to those skilled in the semiconductor arts. Oxide etch is typically performed using $CF_4$, $CHF_3$ or $C_4F_8$ chemistry to leave oxide regions 4a and 4b. Significantly, oxide has been removed from region 6 which will eventually be converted in subsequent steps to a DRAM cell. Regions 4a and 4b are a scaffolding structure for capacitor formation and serve to electrically isolate adjacent DRAM cells. The width of support structures 4a and 4b depends upon the critical dimension of the process technology employed. In a preferred embodiment, regions 4a and 4b are between about 0.1 and 0.5 micrometers wide.

Figure 5:
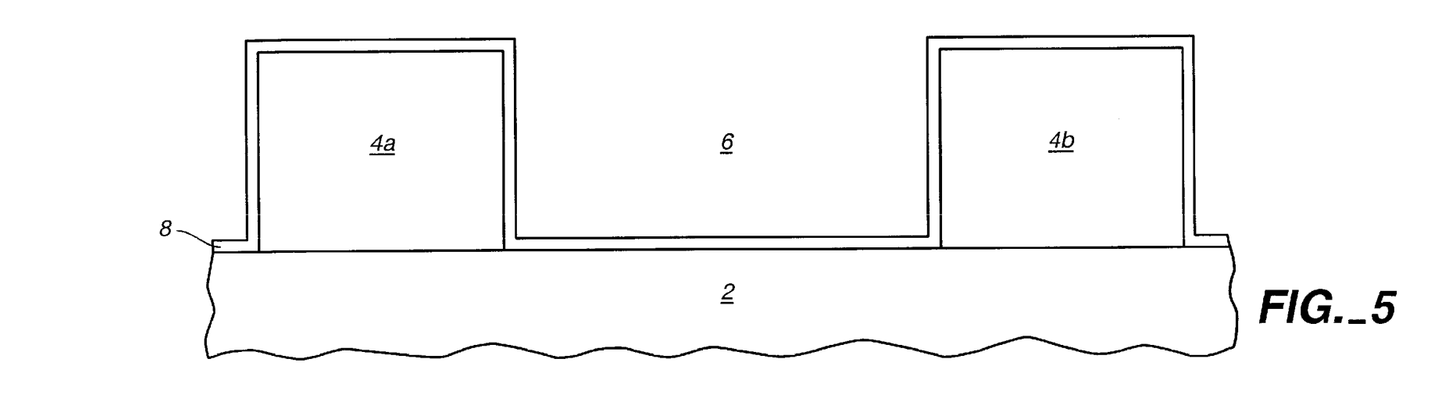
FIG. 5 is a cross sectional view of a partially fabricated DRAM device after liner deposition.

FIG. 5 is a cross sectional view of a partially fabricated DRAM device after liner deposition. Preferably, layer 8 will be silicon nitride which is typically deposited using conventional low pressure CVD conditions Alternatively, layer 8 can be silicon oxide, alternating layers of silicon oxide and nitride or other suitable materials. Layer 8 prevents diffusion and protects semiconductor substrate 2 and oxide regions 4a and 4b from degradation in subsequent process steps. Preferably, layer 8 is between about 200 Å and about 300 Å thick.

Figure 6:
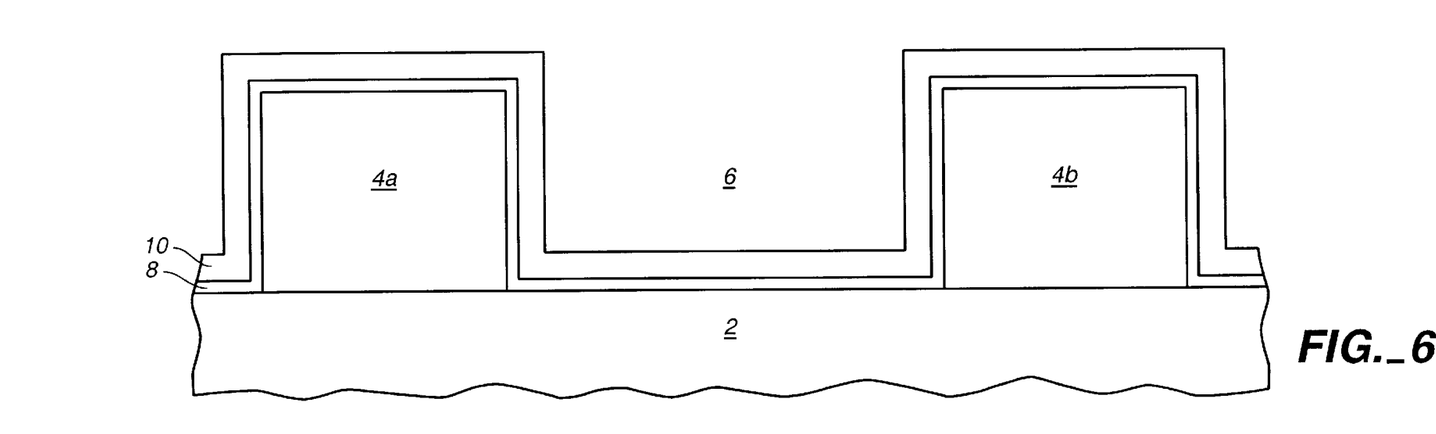
FIG. 6 is a cross sectional view of a partially fabricated DRAM device after deposition of a conductive material (e.g., doped polysilicon) which is converted to a capacitor storage node in subsequent steps.

FIG. 6 is a cross sectional view of a partially fabricated DRAM device after blanket deposition of doped polysilicon layer 10. While polysilicon is a preferred material for the plate, other conductive materials may be used in its place (e.g., cobalt, titanium, and tungsten silicide). Layer 10 is deposited using conventional low pressure CVD conditions and is typically between about 200 and about 2000 angstroms thick ( Most preferably between about 400 and about 700 angstroms thick).Preferably doped polysilicon has a dopant concentration of between about $5 \times 10^{19}$ and about $1 \times 10^{20}$ atoms/cm$^3$. Layer 10 is converted into a capacitor storage plate in subsequent processing steps.

Either n or p type dopants may be used in doped polysilicon layer 10 although, typically, the type of dopant used depends on the nature of semiconductor substrate 2. For example, when semiconductor substrate 2 is a uniformly lightly p doped single crystal silicon wafer, a n type dopant is used in doped polysilicon layer 10.

The direction through which the support cross section is viewed is irrelevant to the process steps previously described. However, in the ensuing process step, the location of the first capacitor plates are defined as shown in FIGS. 6 and 8. Thus, the direction of the cross sectional view in subsequent steps determines whether a DRAM capacitor is or is not shown in the support cross section. Thus, the support, as viewed in FIGS. 8 and 9B, follows the vertical cross section line B illustrated in FIG. 7 and therefore does not show a capacitor plate. However, the support illustrated in FIGS. 6, 9A and subsequent figures follows a horizontal cross section line A shown in FIG. 7 and therefore shows a capacitor plate.

Figure 7:
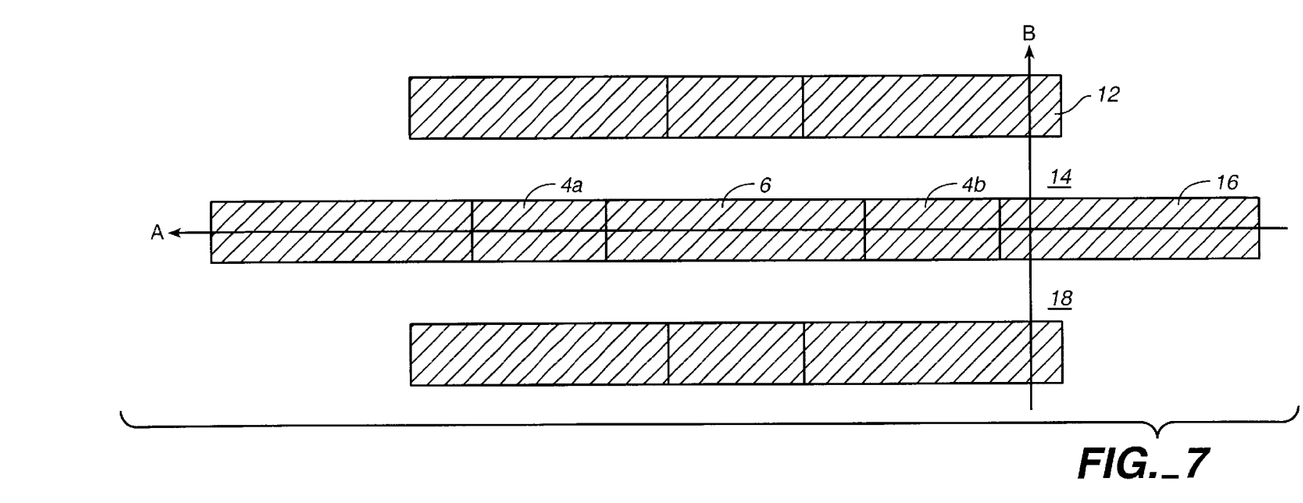
FIG. 7 is a top view illustrating a mask for a first polysilicon etch.
Figure 8:
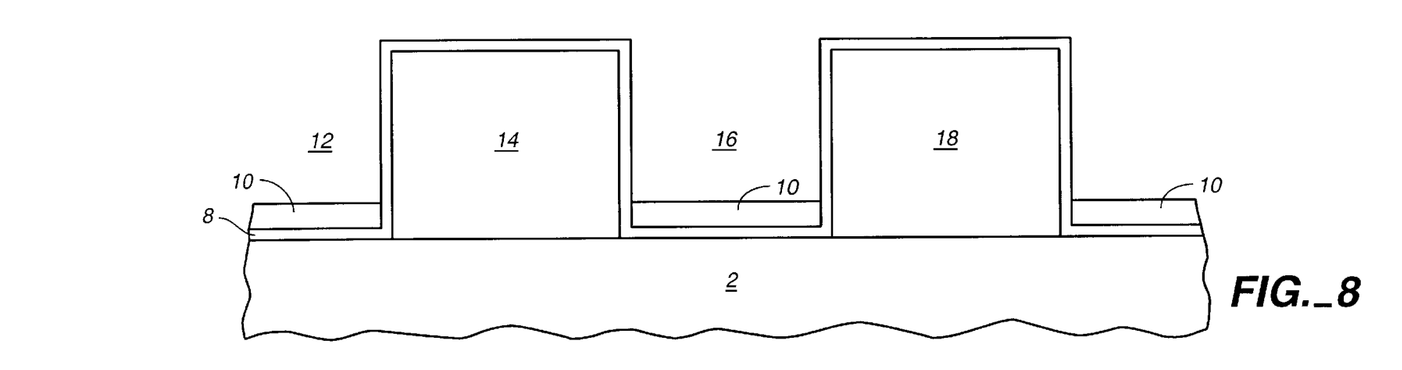
FIG. 8 is a cross sectional view of a partially fabricated DRAM device through a cross section line B (shown in the vertical direction in FIG. 7) after isotropic etching of polysilicon.

FIG. 7 is a is a top view illustrating a mask for isotropic polysilicon etching. Masking completely protects doped polysilicon regions 4a, 4b and 6. The mask is first patterned to define exposed regions 14 and 18. The mask takes the form of linear strips where the interior of regions 4a, 4b, 6, 12 and 16 regions are protected and regions 14 and 18 are exposed. In general, a patterned mask will include regions containing an etchant resistant material that protects doped polysilicon region during the subsequent etch. The patterning process may be performed by photolithography or other well known methods.

The partially fabricated DRAM device viewed through the horizontal cross section line A shown in FIG. 7 after isotropic etching of doped polysilicon is identical to the device illustrated in FIG. 6. The masking completely protects doped polysilicon in regions 4a, 6, and 4b from the etch conditions in this cross sectional view.

FIG. 8 is a cross sectional view of a partially fabricated DRAM device through the vertical cross section line B shown in FIG. 7 after isotropic etching of polysilicon. Importantly, doped polysilicon on the vertical sidewalls of regions 12 and 16 (corresponding to the horizontal lines depicted in FIG. 7) is completely removed by isotropic etch. The bottom of regions 12 and 16 which was protected by the mask retains doped polysilicon.

Figure 9A:
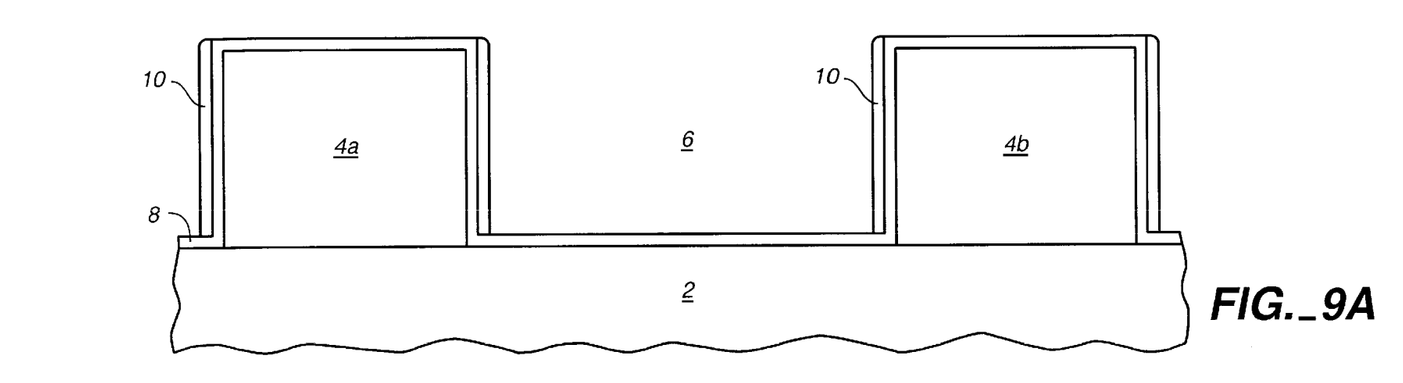
FIG. 9A is a cross sectional view of a partially fabricated DRAM device through a cross section line A (perpendicular to the first cross section line) shown in FIG. 7 after mask removal and polysilicon spacer etching to form storage plates for the capacitors.

FIG. 9A is a cross sectional view of a partially fabricated DRAM device through the horizontal cross section line A shown in FIG. 7 after mask removal and polysilicon spacer etching. The doped polysilicon region 10, shown in FIG. 6 cannot be used as a capacitor plate since it conductively connects capacitors of two adjacent cells. The polysilicon spacer etch selectively removes doped polysilicon from the top of supports 4a and 4b. Doped polysilicon on the vertical sidewalls of support 4a and 4b is largely unaffected by spacer etch conditions. Furthermore, spacer etch removes all doped polysilicon in the bottom of region 6 thus electrically isolating doped polysilicon on the vertical sidewalls of support 4a and 4b. Electrically isolated doped polysilicon layer 10 functions as a capacitor plate in support sidewall capacitors. Any suitable polysilicon spacer etch conditions may be employed. Typically, the etch will include a significant physical etching or sputtering component to ensure a highly anisotropic etch which selectively removes doped polysilicon on top of oxide regions 4a and 4b and in the bottom region 6.

Figure 9B:
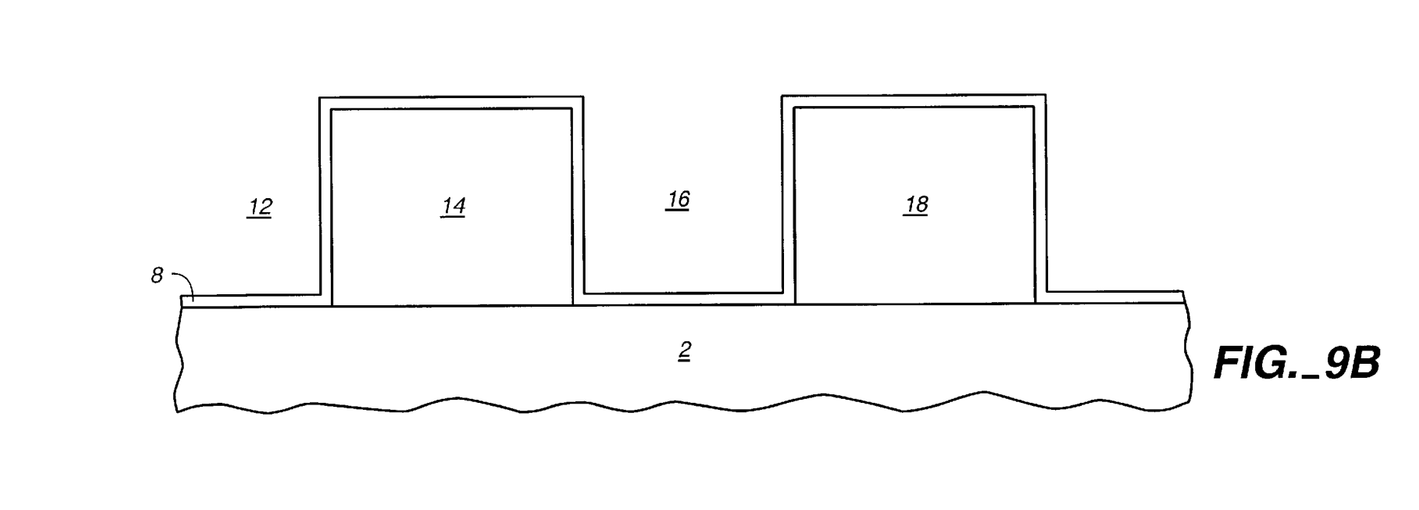
FIG. 9B is a cross sectional view of a partially fabricated DRAM device through the cross section line B shown in FIG. 7 after mask removal and polysilicon spacer etching to form storage plates for the capacitors.

FIG. 9B is a cross sectional view of a partially fabricated DRAM device through the vertical cross section line shown in FIG. 7 after mask removal and polysilicon spacer etching. The isotropic and anisotropic etches have completely removed all doped polysilicon. Thus, no capacitor plates are formed on the sidewalls of regions 12 and 16.

The following Figures depict only the cross sectional view taken through the horizontal cross section line A shown in FIG. 7 since subsequent process steps effect both cross sections identically.

Figure 10:
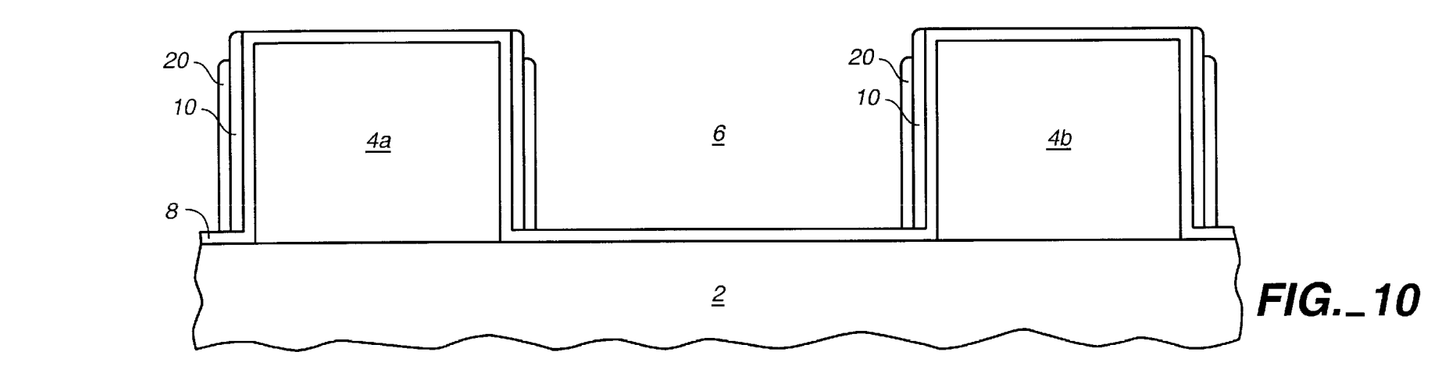
FIG. 10 is a cross sectional view of a partially fabricated DRAM device after node dielectric deposition and node spacer etch.

FIG. 10 is a cross sectional view of a partially fabricated DRAM device after node dielectric deposition and node spacer etch. Node dielectric layer 20 is conformally deposited using a suitable chemical vapor deposition (CVD) process for example. Preferably, tantalum pentaoxide ($Ta_2O_5$) is used to form layer 20. Alternatively, silicon oxide ($SiO_2$), silicon nitride($Si_{3Nx}$), silicon oxide/silicon nitride/ silicon oxide sandwich structure (ONO), BST, PZT or other suitable dielectric materials can be used to provide layer 20. The thickness of layer 20 depends upon, inter alia, the dielectric constant of the material in the layer, the surface area occupied by the capacitor plates, etc. Preferably, node dielectric layer 20 is between about 20 Å and about 200 Å thick. Most preferably, node dielectric layer 20 is between about 40 Å and about 100 Å thick.

Anisotropic etching removes node dielectric 20 located at the top of support 4 and over region 6. Preferably, a dry etch such as argon etch with a significant physical etching or sputtering component is used to remove the node dielectric material. Importantly, the vertical height of node dielectric 20 is less than the vertical height of doped polysilicon 10 which is essential for capacitor function. Etch conditions should be closely monitored to control the vertical height of node dielectric and are best determined by measuring the etch rate.

Figure 11:
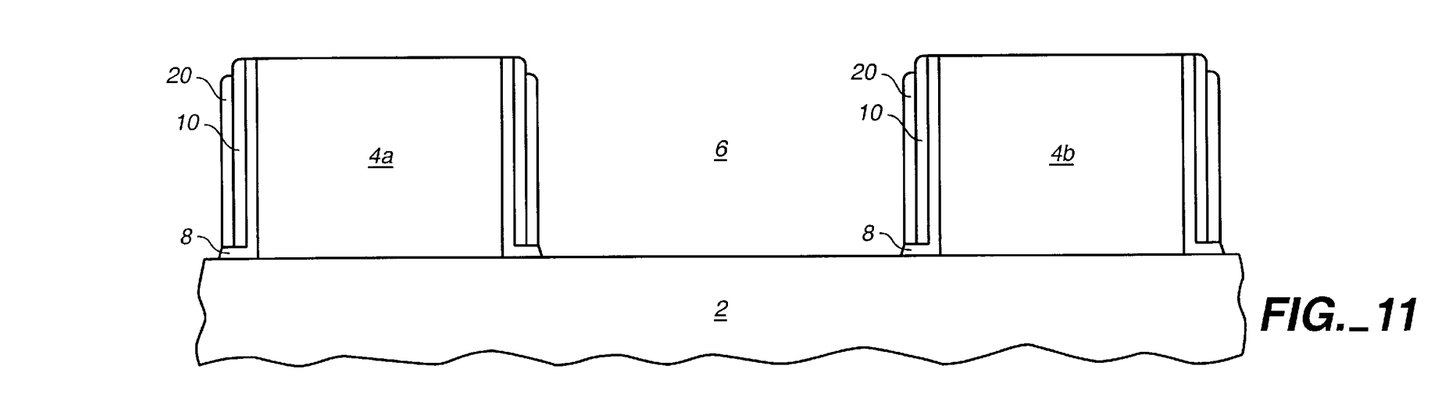
FIG. 11 is a cross sectional view of a partially fabricated DRAM device after liner etch.

FIG. 11 is a cross sectional view of a partially fabricated DRAM device after etching to remove exposed portions of liner 8. Typically, a conventional anisotropic etch removes exposed portions of liner 8. Significantly, a small portion of liner 8 below the first capacitor plate 10 and node dielectric 20 is not affected by the etch conditions. The remaining portion of liner 8 isolates the first capacitor plate 10 and the node dielectric 20 from the underlying semiconductor substrate 2.

Figure 12:
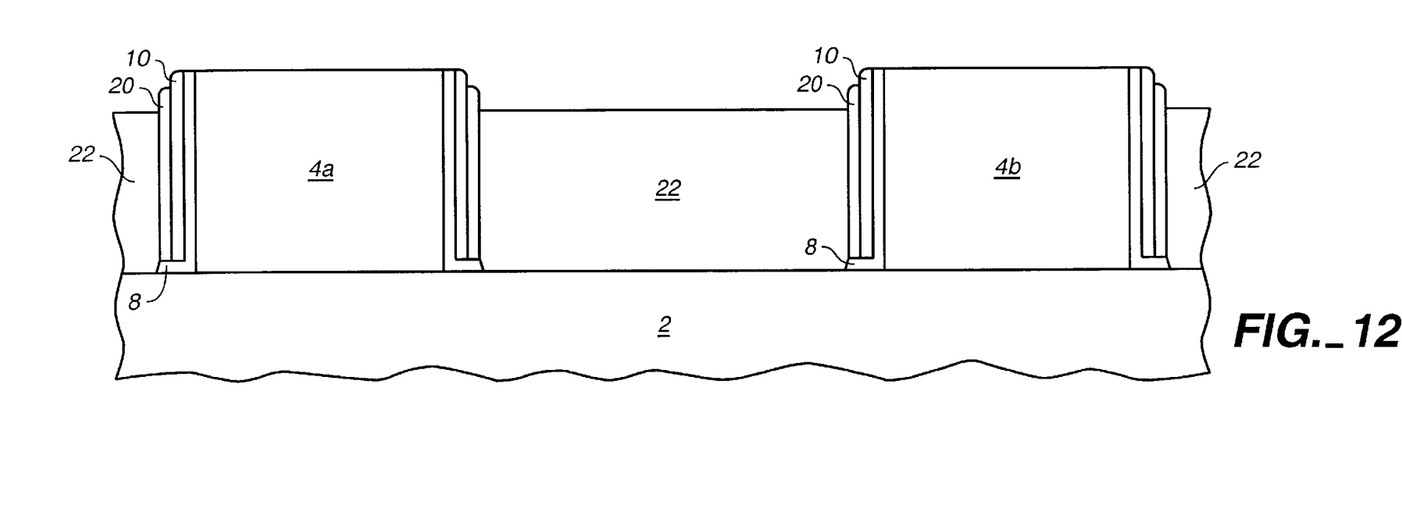
FIG. 12 is a cross sectional view of a partially fabricated DRAM device after selective growth of doped epitaxial silicon in active regions (outside the support structure).

FIG. 12 is a cross sectional view that illustrates the partially fabricated DRAM device after anisotropic doped epitaxial silicon growth in the region between support layers 4a and 4b. Direction selective epitaxial silicon growth, which is known in the art (see, H. Hada et al., *Tech Dig. IEDM,* 666, 1995), may be employed to form epitaxial silicon layer 22. This layer serves as the second capacitor plate and thus complete capacitor formation.

Preferably, doped epitaxial silicon layer 22 is grown using ultra high vacuum CVD deposition. The epitaxial silicon layer 22 may be between about 0.2 micrometer and about 7 micrometers high. More preferably, the epitaxial silicon layer is between about 0.2 micrometer and about 1 micrometer high. Importantly, the vertical height of the epitaxial silicon layer 22 is less than the vertical height of the node dielectric 20. CVD conditions should be closely monitored to control the vertical height of layer 22 and are best determined by measuring the deposition rate. Preferably, layer 22 is of p-type conductivity. The dopant concentration in the epitaxially grown silicon can be varied through inclusion of varying amounts of dopant in the CVD process. Preferably, the epitaxial silicon layer 22 has a dopant concentration of between about $1 \times 10^{16}$ and $1 \times 10^{19}$ atoms/cm$^3$. Layer 22 typically has a constant dopant concentration.

Figure 13:
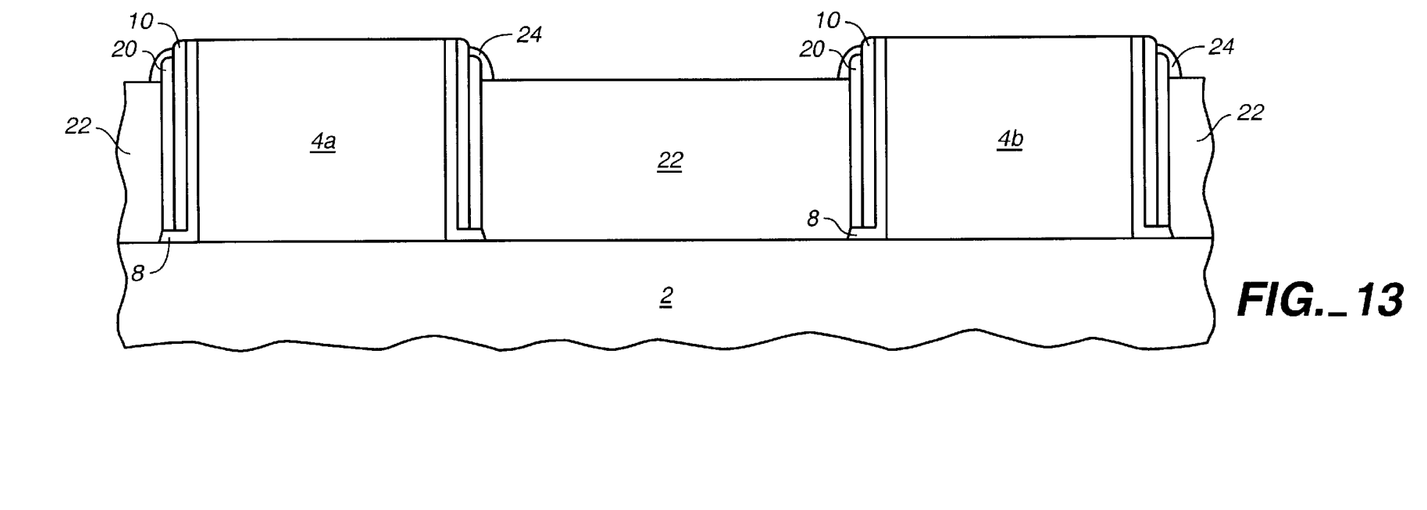
FIG. 13 is a cross sectional view of a partially fabricated DRAM device after nitride deposition and nitride spacer etch to form an insulating cap on the storage plates.

FIG. 13 is a cross sectional view of a partially fabricated DRAM device after nitride deposition and nitride spacer etch. Preferably, nitride layer 24 is between about 200 Å and about 1000 Å thick. Most preferably, layer 20 is between about 300 Å and about 500 Å thick.

Anisotropic spacer etching removes nitride 24 located at the top of support 4a and 4b and over region 6. Preferably, a dry etch with a significant physical etching or sputtering component is used to remove nitride. Importantly, the vertical height of nitride 24 is less than the vertical height of doped polysilicon 10 and greater than node dielectric 20. Etch conditions should be closely monitored to control the vertical height of nitride and are best determined empirically. Nitride 24 partially covers the exposed plate 10 and thus provides electrical isolation of the first capacitor plate 10 from the upper portion second capacitor plate 22 (after subsequent steps).

Figure 14:
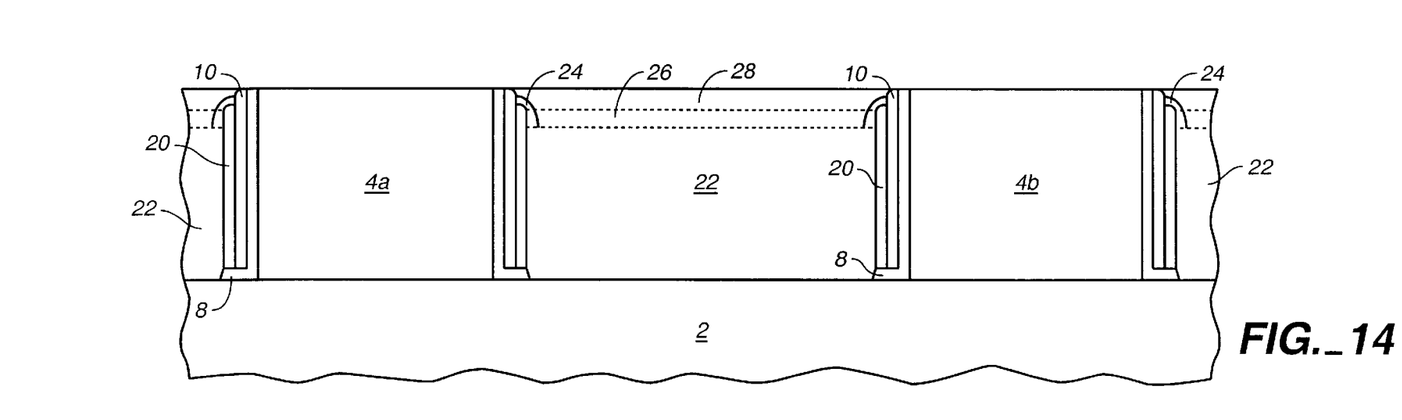
FIG. 14 is a cross sectional view a partially fabricated DRAM device after selective growth of $n^-$ type epitaxial silicon, selective growth of p type doped epitaxial silicon followed by Chemical Mechanical Polishing (CMP).
Figure 15:
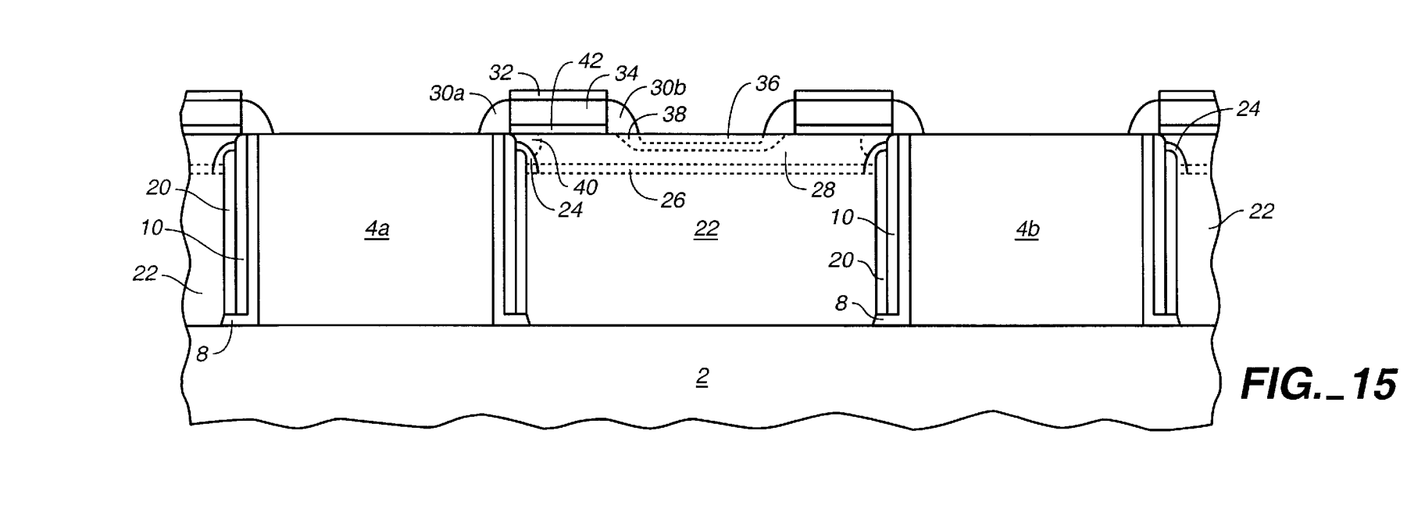
FIG. 15 is a cross sectional view of a partially fabricated DRAM device after transistor formation.

FIG. 14 is a cross sectional view a partially fabricated DRAM device after selective growth of n⁻ type epitaxial silicon layer 26, selective growth of p type doped epitaxial silicon layer 28 followed by Chemical Mechanical Polishing (CMP). Epitaxial silicon layer 26, which is grown using ultra high vacuum CVD deposition, may be between about 300 angstroms and about 1 micrometer thick. More preferably, the epitaxial silicon layer 26 is between about 500 angstroms and about 1000 angstroms thick. Layer 26 is of opposite conductivity to layer 22 and electrically isolates layer 22 and semiconductor substrate 2 from the access transistor which will be formed in subsequent process steps.

Epitaxial silicon layer 28, which is also grown using ultra high vacuum CVD deposition may be between about 500 angstroms and about 0.5 micrometers thick. More preferably, the epitaxial silicon layer 28 is between about 0.1 micrometers and about 0.3 micrometers thick. Layer 28 is the same conductivity type as layer 22 and semiconductor substrate 2 and of opposite conductivity to layer 26. Access transistors are formed on layer 28 after CMP or other suitable planarization methods are used to remove any epitaxial silicon above the level of supports 4a and 4b. In an alternative embodiment, layers 26 and 28 are deposited in one step and have a uniform conductivity type.

FIG. 15 is a cross sectional view of the partially fabricated DRAM device after fabrication of pass transistors. It should be understood that any suitable process steps may be employed to fabricate the pass transistors, which are typically conventional MOS transistors. A gate oxide layer 42 is formed over epitaxial silicon layer 28 using well known methods such as a controlled thermal oxidation. Thereafter, a gate electrode material such as polysilicon is deposited over gate oxide layer 42 and then patterned using methods well known to one skilled in the art to provide gate electrodes 34.

Next, source regions 38 are formed. In some cases, source regions 38 are formed in a single implant step. In many conventional fabrication schemes the source 38 will be formed in two steps. In such processes, a Lightly Doped Drain Implant (LDD) is initially performed to provide a doped source region extending under gate oxide layer 42. Source regions 38 are completed after forming spacers 30a and 30b adjacent to the gate electrodes 34. The spacers may be formed by depositing a blanket layer of oxide or nitride on the wafer surface followed by anisotropic etch. Then a second ion implant forms source regions 38 that extend beyond the spacers. The polysilicon gate electrodes 34 may be exposed to one or both of the implants depending on how much dopant is needed in the gate.

At some point in the process, drain regions 40 are formed. In a preferred embodiment, they are formed during a thermal process step which diffuses dopant from storage plate 10 into epitaxial silicon layer 28. Such a thermal step may be a separate step performed exclusively for the purpose of forming drain regions 40 or it may be another step required for some other process such as formation of gate oxide 42 or a subsequent silicide formation step. In any event, it is necessary at some point to form drain regions 40 in order to complete the pass transistors which are electrically coupled to the support side wall capacitors.

After the source/drain regions have been formed, silicide regions 32 and 36 may formed on top of the gate electrodes and source regions respectively to create less resistive contacts. Then, a passivation layer of, e.g., borophosphosilicate glass ("BPSG") is deposited over the entire structure to define an interlayer dielectric (ILD).

Suitable back end process steps will now be described. Initially, a contact mask is formed on the passivation layer (ILD) to define contact regions to device elements on the substrate and to the associated polysilicon gate electrodes. Thereafter, the passivation region is etched (typically by a plasma etch) to form vertical contact holes through the passivation layer to level 1 (the underlying substrate and polysilicon). At this point, a diffusion barrier layer (sometimes referred to as a "glue" layer) made of a material such as a titanium nitride layer is formed to protect the device elements adjacent the contact holes from ingress of metal atoms from a subsequently deposited metallization layer. In some processes, the contact holes are filled with tungsten plugs according to procedures known in the art. A planarization step maybe needed after the via holes are filled. Regardless of whether tungsten plugs are formed, a blanket deposition of a first metallization layer is performed. The first (and all subsequent) metallization layers may be made from various metals used in the industry such as aluminum (Al), aluminum copper (AlCu), or aluminum silicon copper (AlSiCu). These layers are conventionally deposited by sputtering, as is well known in the industry.

After the first metallization layer has been deposited, it is patterned to form lines connecting various DRAM cells. The exact layout of the lines will be determined by the particular DRAM design. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and a dielectric layer is deposited over the first metallization layer in order to insulate this metallization layer from the next successive metallization layer (i.e., the second metallization layer). Typically, oxide or borophosphosilicate glass is used as the dielectric layer, but other dielectrics such as a nitride, spin on glass (SOG), or polyimide films (which can also be laid on by spinning) may also be used. The dielectric layer is then planarized by any appropriate technique. After a dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. These are then filled with tungsten (which is planarized), before the next metallization layer (metal-2) is deposited and patterned as described above. In some cases, it may be necessary to form and pattern one or more additional metallization layers to complete the wiring of the DRAM.

Generally, the DRAMs of this invention can be used in any application where conventional DRAMs find use. They may be used in DRAM chips or as embedded memory in logic chips. Specific examples of embedded memory chips which can make use of the DRAM designs of this invention include printer and graphics integrated circuits.

Although the foregoing invention has been described in some detail to facilitate understanding, it will be apparent that certain changes and modifications may be practiced within the scope of the appended claims. For example, while the specification has been limited to a discussion of doped polysilicon to form a storage node there is in principle no reason why other conductive materials could not be used to form a node. Although support side wall capacitors have been illustrated as being particularly useful in DRAM cells that follow a design rule of 0.25 µm the instant invention is not limited to DRAM cells of these dimensions. Accordingly, the present embodiments are to be considered as illustrative and not restrictive, and the invention is not to be limited to the details given herein, but may be modified within the scope and equivalents of the appended claims.

What is claimed is:

1. A DRAM cell formed on a semiconductor substrate comprising:
    a pass transistor;
    an electrically isolating support structure on said semiconductor substrate wherein said support structure electrically isolates said DRAM cell from one or more adjacent DRAM cells; and
    a capacitor electrically coupled with said pass transistor and formed on a vertical sidewall of said support structure, said capacitor comprising a first and a second capacitor plate separated by a dielectric layer and not extending beyond the sidewall of the support structure, wherein the pass transistor is supported by and located over the second capacitor plate.

2. A DRAM cell formed on a semiconductor substrate comprising:
    a pass transistor;
    an electrically isolating support structure on said semiconductor substrate wherein said support structure electrically isolates said DRAM cell from one or more adjacent DRAM cells; and
    a capacitor electrically coupled with said pass transistor and formed on a vertical sidewall of said support structure, said capacitor comprising a first and a second capacitor plate separated by a dielectric layer,
    wherein said first capacitor plate is defined by a first conductive layer at a section of the sidewall of said support structure and wherein said second capacitor plate is defined by a second conductive layer adjacent to said support structure, and
    wherein said second conductive layer includes at least one of p-doped epitaxial silicon and n-doped epitaxial silicon.

3. A DRAM cell formed on a semiconductor substrate comprising:
    a pass transistor;
    an electrically isolating support structure on said semiconductor substrate wherein said support structure electrically isolates said DRAM cell from one or more adjacent DRAM cells; and
    a capacitor electrically coupled with said pass transistor and formed on a vertical sidewall of said support structure, said capacitor comprising a first and a second capacitor plate separated by a dielectric layer and not extending beyond the sidewall of the support structure,
    wherein said first capacitor plate is defined by a first conductive layer at a section of the sidewall of said support structure and wherein said second capacitor plate is defined by a second conductive layer adjacent to said support structure, and
    wherein the pass transistor is formed on a layer of epitaxial silicon.

4. A DRAM cell formed on a semiconductor substrate comprising:
    a pass transistor;
    an electrically isolating support structure on said semiconductor substrate wherein said support structure electrically isolates said DRAM cell from one or more adjacent DRAM cells; and
    a capacitor electrically coupled with said pass transistor and formed on a vertical sidewall of said support structure, said capacitor comprising a first and a second capacitor plate separated by a dielectric layer, wherein the pass transistor is supported by and located over the second capacitor plate,
    wherein said first capacitor plate is defined by a first conductive layer at a section of the sidewall of said support structure, and wherein said second capacitor plate is defined by a second conductive layer adjacent to said support structure, and wherein a doped layer in epitaxial silicon isolates the pass transistor from the second capacitor plate.

5. The DRAM cell of claim 1 wherein said first capacitor plate is defined by a first conductive layer at a section of the sidewall of said support structure and wherein said second capacitor plate is defined by a second conductive layer adjacent to said support structure.

6. The DRAM cell of claim 5 wherein said pass transistor is a MOS device having a drain that is electrically connected to the first capacitor plate.

7. The DRAM cell of claim 5 wherein said second capacitor plate is electrically isolated from the drain of the pass transistor.

8. The DRAM cell of claim 5 wherein said first conductive layer includes at least one of n-doped polysilicon and p-doped polysilicon.

9. The DRAM cell of claim 5 wherein said second conductive layer includes at least one of p-doped epitaxial silicon and n-doped epitaxial silicon.

10. The DRAM cell of claim 1 wherein said support structure is between about 0.1 micrometers and about 10 micrometers thick.

11. The DRAM cell of claim 10 wherein said support structure includes at least one of oxide, nitride and spin-on glass.

12. The DRAM cell of claim 11 wherein said support structure includes oxide.

13. The DRAM cell of claim 5 wherein said second conductive layer is between about 0.2 micrometers and about 7 micrometers high.

14. The DRAM cell of claim 5 wherein said first conductive layer of said first capacitor plate is between about 200 Å and about 1000 Å thick.

15. The DRAM cell of claim 1 wherein said dielectric layer includes at least one of $SiO_2$, $Si_3N_x$, silicon oxynitride, sandwich layers of $SiO_2/Si_3N_x/SiO_2$, $Ta_2O_5$, BST and PZT.

16. The DRAM cell of claim 1 wherein said dielectric layer has a dielectric constant of at least about 10.

17. The DRAM cell of claim 15 wherein said dielectric layer includes $Ta_2O_3$.

18. The DRAM cell of claim 1 wherein said dielectric layer is between about 20 Å and about 200 Å thick.

19. The DRAM cell of claim 5 wherein said second conductive layer includes p type doped epitaxial silicon.

20. The DRAM cell of claim 5 wherein the pass transistor is formed on a layer of epitaxial silicon.

21. The DRAM cell of claim 20 wherein a doped layer in epitaxial silicon isolates the pass transistor from the second capacitor plate.

22. The DRAM cell of claim 1, wherein the DRAM cell is linked to a second DRAM cell by the second capacitor plate, wherein the second DRAM cell employs the second capacitor plate as its own capacitor plate, and wherein the second DRAM cell has a second DRAM pass transistor with a source that is shared with a source of the pass transistor.

* * * * *